United States Patent
Boehm et al.

(10) Patent No.: US 9,643,508 B2
(45) Date of Patent: May 9, 2017

(54) METHOD FOR ESTIMATING AN ACCURATE STATE OF CHARGE FOR INITIALIZING A BATTERY MANAGEMENT SYSTEM

(75) Inventors: Andre Boehm, Kornwestheim (DE); Stefan Wickert, Albershausen (DE)

(73) Assignees: Samsung SDI Co., Ltd., Yongin-si, Gyeonggi-do (KR); Robert Bosch GmbH, Stuttgart (DE)

( * ) Notice: Subject to any disclaimer, the term of this patent is extended or adjusted under 35 U.S.C. 154(b) by 1168 days.

(21) Appl. No.: 13/500,808

(22) PCT Filed: Aug. 18, 2010

(86) PCT No.: PCT/EP2010/062032
§ 371 (c)(1),
(2), (4) Date: Jun. 21, 2012

(87) PCT Pub. No.: WO2011/042245
PCT Pub. Date: Apr. 14, 2011

(65) Prior Publication Data
US 2012/0262126 A1    Oct. 18, 2012

(30) Foreign Application Priority Data
Oct. 9, 2009   (DE) .................. 10 2009 045 526

(51) Int. Cl.
*B60L 11/18* (2006.01)
*H01M 10/42* (2006.01)
(Continued)

(52) U.S. Cl.
CPC ..... *B60L 11/1861* (2013.01); *H01M 10/4257* (2013.01); *H01M 10/44* (2013.01);
(Continued)

(58) Field of Classification Search
CPC .... B60L 11/18; B60L 11/1861; G01R 31/362; G01R 31/3679; G01R 31/36;
(Continued)

(56) References Cited

U.S. PATENT DOCUMENTS

| 4,460,870 | A | * | 7/1984  | Finger          | G01R 31/362 |
|           |   |   |         |                 | 320/136     |
| 4,677,363 | A | * | 6/1987  | Kopmann         | 320/131     |
| 4,725,784 | A | * | 2/1988  | Peled           | G01R 31/3648 |
|           |   |   |         |                 | 320/149     |
| 5,119,011 | A | * | 6/1992  | Lambert         | B60L 11/1862 |
|           |   |   |         |                 | 318/139     |
| 5,557,188 | A | * | 9/1996  | Piercey         | 320/134     |
| 5,596,262 | A | * | 1/1997  | Boll            | B60L 11/12  |
|           |   |   |         |                 | 320/DIG. 21 |
| 5,691,078 | A | * | 11/1997 | Kozaki et al.   | 324/428     |
| 5,808,447 | A | * | 9/1998  | Hagino          | 320/139     |
| 5,825,155 | A | * | 10/1998 | Ito et al.      | 320/118     |
| 5,903,131 | A | * | 5/1999  | Sekine et al.   | 320/106     |
| 5,936,383 | A | * | 8/1999  | Ng et al.       | 320/132     |
| 6,150,823 | A | * | 11/2000 | Takahashi et al.| 324/427     |

(Continued)

FOREIGN PATENT DOCUMENTS

| CN | 1988242 A    | 6/2007 |
| CN | 101141013 A  | 3/2008 |

(Continued)

OTHER PUBLICATIONS

"Battery Management System," Electropaedia, Mpower, Published May 9, 2008, Accessed May 6, 2015, http://web.archive.org/web/20080509125115/http://www.mpoweruk.com/bms.htm.*

(Continued)

*Primary Examiner* — Robert Grant
*Assistant Examiner* — John Trischler
(74) *Attorney, Agent, or Firm* — Maginot, Moore & Beck LLP

(57) ABSTRACT

A method for initializing and operating a battery management system is disclosed. The method comprises the following steps. First, start the battery management system. Next, read battery variables which are stored in a nonvolatile memory of the battery and comprise the last state of charge of the battery. Then measure the open-circuit voltage of the battery. Next, determine an instantaneous state of charge value on the basis of the measured open-circuit voltage. Then determine an estimated value of the state of charge of the battery as a function of both the stored last state of charge of the battery and the instantaneous state of charge value. Then initialize the state of charge in the battery management (Continued)

system using the determined estimated value of the state of charge. Finally, operate the battery management system with the initialized values.

10 Claims, 3 Drawing Sheets

(51) Int. Cl.
    *H01M 10/44*           (2006.01)
    *H01M 10/48*           (2006.01)
    *G01R 31/36*           (2006.01)

(52) U.S. Cl.
    CPC ........... *H01M 10/48* (2013.01); *G01R 31/362* (2013.01); *G01R 31/3679* (2013.01); *Y02T 10/705* (2013.01); *Y02T 10/7005* (2013.01); *Y02T 10/7044* (2013.01)

(58) Field of Classification Search
    CPC .. H01M 10/4257; H01M 10/48; H01M 10/44; Y02T 10/705; Y02T 10/7005; Y02T 10/7044; H02J 7/00; B60K 6/28
    USPC ........ 320/132, 133, 104, 134, 162; 324/426, 324/427
    See application file for complete search history.

(56) References Cited

U.S. PATENT DOCUMENTS

| | | | |
|---|---|---|---|
| 6,163,133 A * | 12/2000 | Laig-Horstebrock | G01R 31/362 320/130 |
| 6,359,419 B1 * | 3/2002 | Verbrugge | B60K 6/44 320/132 |
| 6,366,054 B1 * | 4/2002 | Hoenig et al. | 320/132 |
| 6,388,450 B2 * | 5/2002 | Richter et al. | 324/427 |
| 6,424,157 B1 * | 7/2002 | Gollomp | G01R 31/006 320/132 |
| 6,441,619 B1 * | 8/2002 | Araki | G01R 31/361 320/134 |
| 6,515,456 B1 * | 2/2003 | Mixon | 320/160 |
| 6,531,874 B2 * | 3/2003 | Mentgen et al. | 324/427 |
| 6,583,606 B2 * | 6/2003 | Koike | H02J 7/0075 320/149 |
| 6,947,855 B2 * | 9/2005 | Verbrugge et al. | 702/63 |
| 7,154,247 B2 * | 12/2006 | Kikuchi et al. | 320/132 |
| 7,406,389 B2 * | 7/2008 | Emori et al. | 702/85 |
| 7,453,235 B2 * | 11/2008 | Blair et al. | 320/116 |
| 7,573,237 B2 * | 8/2009 | Cutrona | G01R 31/362 320/114 |
| 7,576,545 B2 * | 8/2009 | Singh | G01R 31/3634 320/132 |
| 7,676,334 B2 * | 3/2010 | Matsuura et al. | 702/63 |
| 7,679,329 B2 * | 3/2010 | Lim et al. | 320/132 |
| 7,688,032 B2 * | 3/2010 | Kamishima et al. | 320/132 |
| 7,816,892 B2 * | 10/2010 | Chen | H02J 7/0072 320/162 |
| 7,893,652 B2 * | 2/2011 | Suzuki | B60L 11/1861 320/104 |
| 7,944,178 B2 * | 5/2011 | Tamezane | 320/132 |
| 8,046,181 B2 * | 10/2011 | Kang et al. | 702/63 |
| 8,175,826 B2 * | 5/2012 | Kang et al. | 702/63 |
| 8,212,519 B2 * | 7/2012 | Koch | G01R 31/3606 320/104 |
| 8,380,452 B2 * | 2/2013 | Maegawa et al. | 702/63 |
| 8,598,840 B2 * | 12/2013 | Yount | B60L 3/0046 320/107 |
| 8,635,037 B2 * | 1/2014 | Quet | H01M 8/04656 320/132 |
| 8,639,460 B2 * | 1/2014 | Kang et al. | 702/63 |
| 9,108,524 B2 * | 8/2015 | Zhang | B60L 11/1861 |
| 2001/0009370 A1 * | 7/2001 | Richter et al. | 324/426 |
| 2002/0014879 A1 * | 2/2002 | Koike | H02J 7/0075 320/133 |
| 2002/0030494 A1 * | 3/2002 | Araki | G01R 31/361 324/427 |
| 2002/0101243 A1 * | 8/2002 | Mentgen et al. | 324/427 |
| 2002/0195999 A1 * | 12/2002 | Kimura et al. | 320/134 |
| 2003/0173123 A1 * | 9/2003 | Nakanowatari | B60K 6/44 180/65.225 |
| 2003/0236601 A1 * | 12/2003 | McLeod et al. | 701/29 |
| 2004/0008031 A1 * | 1/2004 | Arai | H01M 10/48 324/429 |
| 2004/0160214 A1 * | 8/2004 | Blair et al. | 320/118 |
| 2006/0076929 A1 * | 4/2006 | Tatsumi et al. | 320/132 |
| 2006/0220619 A1 * | 10/2006 | Namba | G01R 31/3651 320/149 |
| 2007/0024242 A1 * | 2/2007 | Seo et al. | 320/132 |
| 2007/0065713 A1 * | 3/2007 | Rauchfuss | G01R 19/16542 429/66 |
| 2007/0090803 A1 * | 4/2007 | Yun et al. | 320/128 |
| 2007/0096743 A1 * | 5/2007 | Arai | G01R 31/3679 324/426 |
| 2007/0139013 A1 * | 6/2007 | Seo et al. | 320/130 |
| 2007/0139015 A1 * | 6/2007 | Seo et al. | 320/132 |
| 2007/0145948 A1 * | 6/2007 | Lim et al. | 320/132 |
| 2007/0148532 A1 * | 6/2007 | Lim et al. | 429/50 |
| 2007/0262750 A1 * | 11/2007 | Yun et al. | 320/132 |
| 2007/0299620 A1 * | 12/2007 | Yun et al. | 702/63 |
| 2008/0030169 A1 * | 2/2008 | Kamishima et al. | 320/134 |
| 2008/0036421 A1 * | 2/2008 | Seo | B60K 6/28 320/132 |
| 2008/0053715 A1 * | 3/2008 | Suzuki | B60L 11/1861 180/2.1 |
| 2008/0065336 A1 * | 3/2008 | Seo et al. | 702/63 |
| 2008/0077339 A1 * | 3/2008 | Seo et al. | 702/63 |
| 2008/0183408 A1 * | 7/2008 | Matsuura et al. | 702/63 |
| 2008/0208494 A1 * | 8/2008 | Holz | G01R 31/3675 702/64 |
| 2008/0238371 A1 * | 10/2008 | Tamezane | 320/134 |
| 2009/0051321 A1 * | 2/2009 | Sato | 320/132 |
| 2009/0055330 A1 * | 2/2009 | Medasani | G01R 31/3693 706/2 |
| 2009/0140742 A1 * | 6/2009 | Koch | G01R 31/3606 324/426 |
| 2010/0174499 A1 * | 7/2010 | Kang et al. | 702/63 |
| 2010/0213901 A1 * | 8/2010 | Morimoto et al. | 320/145 |
| 2010/0250163 A1 * | 9/2010 | Maegawa et al. | 702/63 |
| 2010/0280777 A1 * | 11/2010 | Jin et al. | 702/63 |
| 2011/0127963 A1 * | 6/2011 | Murao et al. | 320/118 |
| 2011/0213576 A1 * | 9/2011 | Motz et al. | 702/63 |
| 2011/0254502 A1 * | 10/2011 | Yount | B60L 3/0046 320/107 |
| 2012/0143585 A1 * | 6/2012 | Barsukov et al. | 703/18 |
| 2012/0191390 A1 * | 7/2012 | Kang et al. | 702/63 |
| 2013/0144547 A1 * | 6/2013 | Yun et al. | 702/63 |
| 2014/0232411 A1 * | 8/2014 | Vaidya | G01R 31/3624 324/426 |
| 2014/0354236 A1 * | 12/2014 | Kim | 320/134 |
| 2015/0112527 A1 * | 4/2015 | Zhang | B60L 11/1861 701/22 |

FOREIGN PATENT DOCUMENTS

| | | |
|---|---|---|
| DE | 100 10 980 A1 | 9/2001 |
| EP | 1 801 606 A2 | 6/2007 |
| EP | 1 897 772 A2 | 3/2008 |

OTHER PUBLICATIONS

"State of Health (SOH) Determination," Electropaedia, Published May 11, 2008, accessed Mar. 11, 2015, https://web.archive.org/web/20080511160803/http://www.mpoweruk.com/soh.htm.*

(56) References Cited

OTHER PUBLICATIONS

International Search Report corresponding to PCT Application No. PCT/EP2010/062032, mailed Dec. 9, 2011 (German and English language document) (4 pages).

* cited by examiner ized value of the state of charge $SOC_{est}$ of the battery as a function of both the stored last state of charge $SOC_{old}$ of the battery and the instantaneous state of charge value $SOC_{inst}$; initializing the state of charge in the battery management system using the determined estimated value of the state of charge $SOC_{est}$; and finally operating the battery management system with the initialized values.

METHOD FOR ESTIMATING AN ACCURATE STATE OF CHARGE FOR INITIALIZING A BATTERY MANAGEMENT SYSTEM

PRIOR ART

This application is a 35 U.S.C. §371 National Stage Application of PCT/EP2010/062032, filed on Aug. 18, 2010, which claims the benefit of priority to Serial No. DE 10 2009 045 526.4, filed on Oct. 9, 2009 in Germany, the disclosures of which are incorporated herein by reference in their entirety.

BACKGROUND

A hybrid or electric vehicle uses electrical energy, which is stored in a battery, as an energy source. In order to operate such a battery, it is crucial in this case to be able to determine the state of the battery and the capacity of the battery for continued operation. For this purpose, the operation of the battery is managed using a battery management system. Battery packs using Li ions or NiMH technology, which consist of a large number of electrochemical cells connected in series and/or in parallel, are thus used in hybrid and electric vehicles. The battery management system is used to monitor the battery and, in addition to monitoring safety, is intended to ensure a service life which is as long as possible.

For battery management, the voltage of each individual cell is measured, together with the battery current and the battery temperature, and the state of charge and the state of ageing, for example, are estimated. In order to maximize the service life, it is necessary to know the instantaneous maximum power capacity of the battery at any time. If this power limit is exceeded, the ageing of the battery may be rapidly accelerated.

Methods which are active during operation are known for determining the battery state, in particular the state of charge (SOC). These methods are based on the relationship between the battery voltage and the SOC. However, the open-circuit voltage (OCV) is relevant here. Since the methods are active during operation, the measured voltage must be corrected by the voltage drop caused by the flowing current and the internal resistance of the battery. For this purpose, use is made of impedance models which contain errors. DE 100 45 980 A1 thus discloses a battery management system for determining the state of charge of the battery from the measurement of the internal resistance $R_i$. The only time at which the correct OCV can be measured is during starting of the system following a pause, that is to say during initialization.

SUMMARY

The disclosure relates to a method for determining the state of charge and the state of ageing of a battery, the state of charge being estimated by taking into account a state of charge stored last.

The disclosure accordingly proposes a method for initializing and operating a battery management system, which comprises the following steps of: starting the battery management system; reading battery variables which are stored in a nonvolatile memory of the battery and comprise the last state of charge $SOC_{old}$ of the battery; measuring the open-circuit voltage OCV of the battery; determining an instantaneous state of charge value $SOC_{inst}$ on the basis of the measured open-circuit voltage OCV; determining an esti- The proposed inventive initialization of the battery management system advantageously not only uses a measured or calculated state of charge value $SOC_{inst}$ but also takes into account, when estimating the state of charge, the state of charge which was stored last $SOC_{old}$ and corresponds to the state of charge when the battery management system was last switched off.

The method may also comprise a plausibility check of the state detection by the battery management system. In this case, the plausibility check is based on comparing the instantaneously calculated state of charge value $SOC_{inst}$ and the state of charge stored last $SOC_{old}$. If the difference between these two values is above a predetermined threshold value, a system error or a defect is likely. The battery can be switched off in this case. Slight differences may also indicate ageing and may be taken into account for the SOC calculation using a factor during operation. This factor could influence the calculation of the SOC during operation of the battery. If the difference is below the predetermined threshold value, the battery management system is initialized with the determined estimator of the state of charge $SOC_{est}$. Using the state of charge stored last $SOC_{old}$ when shutting down the system thus makes it possible to monitor the safety of the battery and thus to immediately avoid damage to the battery on account of a defect when starting the system. Before the battery management system is switched off or before initialization, a further plausibility check of the values can also be carried out by comparing the calculated state of charge $SOC_{inst}$ dependent on the open-circuit voltage with a current integral. Subtracting the compared values then reveals, like above, whether the battery should be switched off or whether the future integration for determining the SOC should be corrected with a factor on account of ageing and/or can be initialized.

The instantaneous state of charge $SOC_{inst}$ can be determined in this case using the measured open-circuit voltage OCV and a family of characteristics dependent on the temperature/open-circuit voltage. This determination is thus based on the correctly measured OCV when starting the battery. Impedance models from the prior art are not required here.

In one implementation, the state of charge estimated value $SOC_{est}$ can be determined using weighted averaging of the stored last state of charge $SOC_{old}$ and the instantaneous state of charge $SOC_{inst}$. This enables simple implementation of the consideration of the last state of charge $SOC_{old}$ when switching off the battery.

In one exemplary embodiment, the state of charge stored last $SOC_{old}$ and the instantaneous state of charge can be balanced during the weighted averaging operation. This allows particularly simple implementation of the consideration of the last state of charge $SOC_{old}$.

In another exemplary embodiment, the weighting operation can be carried out in the weighted averaging operation on the basis of the period of time between the last storage of the state of charge $SOC_{old}$ and the determination of the instantaneously calculated state of charge $SOC_{inst}$. When determining the state of charge estimated value $SOC_{est}$, this implementation makes it possible to take into account the time which has passed between the time when the system was last switched off and the time when the system is switched on.

During the initialization of the first measured value acquisition of the open-circuit voltage and current after the battery has been started, the battery variables stored last can be advantageously directly used as initialization values of the corresponding battery variables.

In addition, the determined battery characteristic variables comprising the state of charge of the battery can be stored in the nonvolatile memory of the battery while switching off and/or operating the battery management system and are therefore available to the battery management system when starting the system. Battery variables such as voltage, temperature and model parameters of a mathematical ageing process can also be stored in this case.

Furthermore, the state of charge estimated value $SOC_{est}$ can be adapted over a plurality of measured value cycles during operation of the battery, that is to say the stored battery characteristic variables can be permanently concomitantly included in the calculation of the state of charge of the battery during operation. Since individual voltage or temperature measurements can also fail, the determination process can be continued over a plurality of driving cycles if the determined variables are stored when switching off the system.

The state of charge estimated value $SOC_{est}$ can be adapted using a mathematical ageing model. The input variables of the ageing model may be in this case the measured voltage, the temperature, the integrated charging current and the state of charge $SOC_{old}$ during the last operation of switching off the battery, and the standstill duration, the measured voltage, the temperature and the instantaneous state of charge $SOC_{inst}$ when starting the system. Such mathematical ageing processes can be described using time series. The adaptation can also be carried out using known adaptation methods, for example Kalman filtering, which use only the stored values and the values measured and calculated during the system starts.

In summary, it can be stated that, according to the disclosure, variables determined and/or measured when switching off the battery management system, such as SOC, model parameters, voltage, temperature, etc., are stored in the nonvolatile memory of the battery, for example an EEPROM, optionally for each individual cell, and are available during the next system start. During the next system start, these variables are compared with the then instantaneous measurement variables and model variables calculated from the latter and are used to determine the SOC and model parameters. These values can either be used only to determine the initial values or can be used permanently. Depending on the availability of individual measured values when starting the system, the stored values can be used as a fallback solution. In this case, a plurality of fallback stages which also differ from cell to cell are possible.

The method shall be explained in more detail by way of example below using drawings, in which:

BRIEF DESCRIPTION OF THE DRAWINGS

The invention shall be explained in more detail by way of example below using drawings, in which.

DETAILED DESCRIPTION

Figure 1:
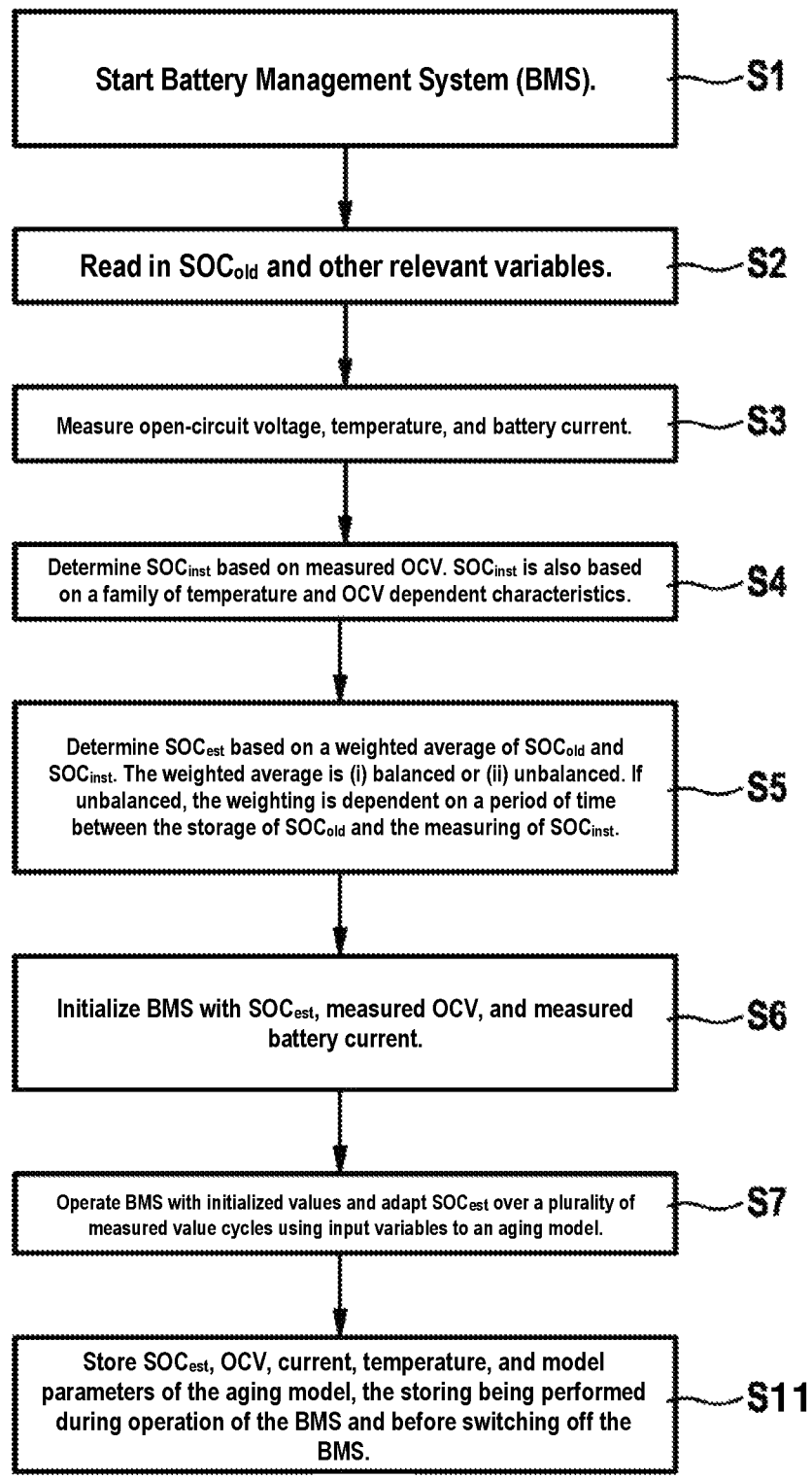
FIG. 1 shows a diagram of a first exemplary embodiment of the method according to the invention.

FIG. 1 shows a diagram of a first exemplary embodiment of the present method. The state of charge $SOC_{old}$ is thus first of all stored when switching off or shutting down the battery management system BMS. Further relevant variables such as ageing characteristic variables, voltage and temperature may also be stored in the nonvolatile memory of the battery. In this case, it should be noted that the BMS also runs during charging of the battery.

As shown in FIG. 1, these values are read from the nonvolatile memory in steps S1 and S2 during the next system start. In this case, it is advantageously possible to determine whether the stored values are valid using a so-called "dirty bit". If the BMS is reset, the memory values may not be able to be written. Setting or not setting the "dirty bit" then makes it possible to determine whether the values were able to be written correctly.

The open-circuit voltage OCV is then measured in step S3 without a load on the battery during the system start. In some embodiments, temperature and battery current is also measured in step S3. The state of charge $SOC_{inst}$ is then instantaneously determined in S4. This state of charge is based on instantaneous measured values and may also be called a state of charge measured value. In the present exemplary embodiment, it is determined or calculated using the measured open-circuit voltage and a family of characteristics dependent on the temperature/OCV. The family of characteristics plots the state of charge as a function of the measured open-circuit voltage. This is preferably carried out on the basis of temperature, that is to say the family of characteristics preferably comprises a plurality of graphs which correspond to the state of charge as a function of the open-circuit voltage at a particular temperature. The associated state of charge is thus automatically read or determined from a measured open-circuit voltage, preferably at a particular temperature, from the family of characteristics.

After the instantaneous state of charge value $SOC_{inst}$ has been calculated or determined, a state of charge estimated value $SOC_{est}$ is determined in step S5. This is effected using the stored state of charge $SOC_{old}$ and the instantaneously determined state of charge $SOC_{inst}$. In the simplest case, the initialization value for the SOC can be effected by averaging the stored $SOC_{old}$ and the instantaneously determined $SOC_{inst}$. In this case, the weighting operation can be carried out by balancing or the period of time between the system being switched off and the system being switched on can be taken into account during the weighting operation.

The battery management system is then initialized with this estimated value in step S6. In some embodiments, the battery management system is also initialized with the measured OCV and measured battery current in step S6. In step S7, the battery management system is operated with the initialized values. In some embodiments, during operation, the $SOC_{est}$ is adapted over a plurality of measured value cycles using input variables to the aging model. In step S11, $SOC_{est}$, OCV, current, temperature, and model parameters of the aging model are stored in the non-volatile memory, the storing being performed during operation of the battery management system and before switching off the battery management system.

Furthermore, as long as the first measured value acquisitions of voltage and current are initialized, the memory values can be directly used as initialization values. If a measured voltage value is invalid, the latter can be initialized by the stored voltage in this case and can then be estimated with an unvarying difference from the average value of the valid measured voltage values. For this purpose, the offset of the voltage measurement could be determined and the voltage sensor output could then be corrected with this offset.

Figure 2:
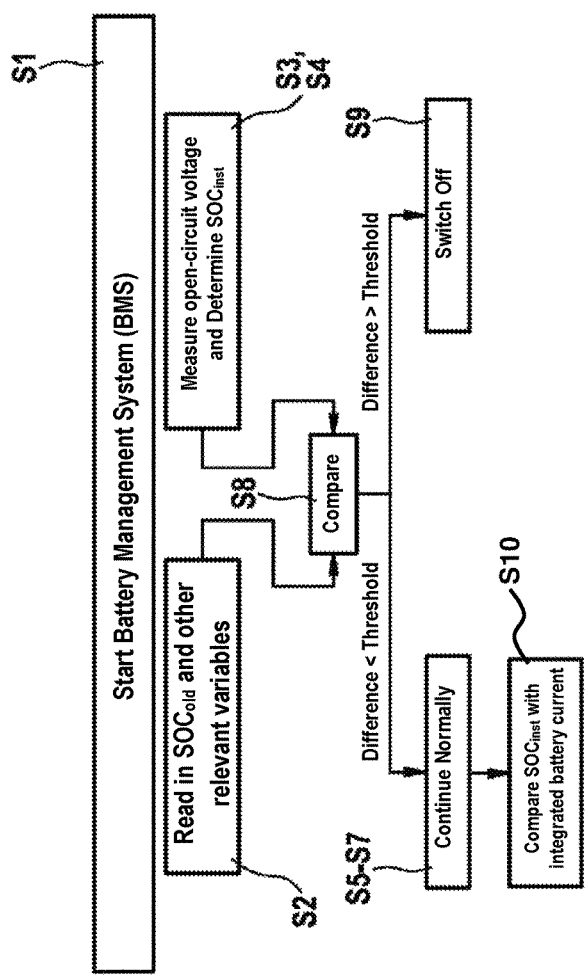
FIG. 2 shows a diagram of a second exemplary embodiment of the method according to the invention.

FIG. 2 shows a further exemplary embodiment of the invention with extended functions. In an interposed step S8, the SOC memory value $SOC_{old}$ is thus compared with the instantaneously calculated state of charge value $SOC_{inst}$. If the stored state of charge $SOC_{old}$ greatly differs from the calculated $SOC_{inst}$, that is to say is above a predetermined threshold value, this indicates a system error or defect. This information can be used in step S9 to detect errors and for immediate switch-off or can first of all be subjected to a plausibility check by further measurements during operation. This further plausibility check can be effected in step S10, for example, by comparing the calculated SOC dependent on the OCV with a current integral.

If the difference is only slight, that is to say it is below a predetermined threshold value, the ageing of this cell could also be the cause. In this case, the estimated capacity of this cell can be corrected. In order to make this evaluation more robust, filtered differences may also be formed over a plurality of cycles. Another alternative is represented by more complex algorithms such as the Kalman filter in which the measured voltage, the temperature, the integrated charging current and the calculated SOC during shut-down, the standstill duration, the measured voltage, the temperature and the calculated SOC when starting the system could be used as input variables of an ageing model in this exemplary embodiment, and a correction of the cell capacity and the impedance model parameter form the output variables.

During operation, the change in the SOC is generally calculated by integrating the current and/or by evaluating the relationship between the OCV and the SOC. In this case, the OCV is determined by correcting the instantaneous cell voltage by the voltage drop caused by the flowing current and the cell impedance. This is also carried out in the present exemplary embodiment during operation of the battery.

Both the cell impedance and the cell capacity as well as the relationship between the OCV and the SOC are subject to an ageing process. The instantaneous state of ageing can be estimated by comparing the values, which were stored in the memory after shut-down, with the values which are measured and determined when starting the system.

Figure 3:
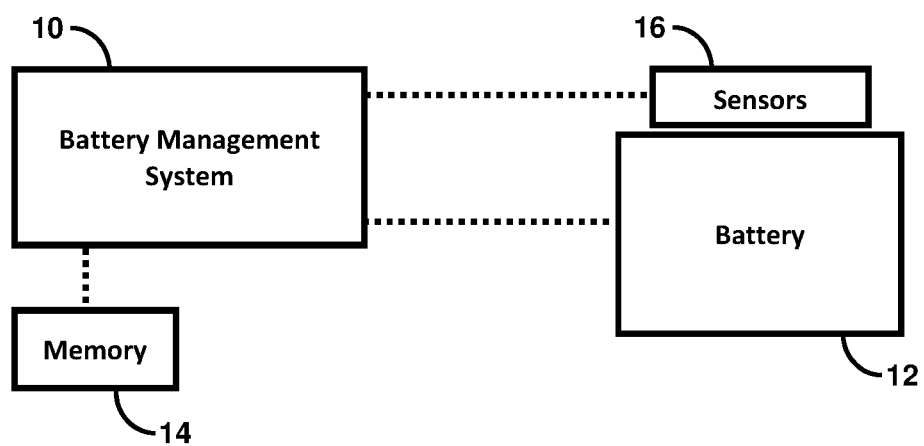
FIG. 3 shows an exemplary battery management system.

FIG. 3 shows an exemplary battery managements system 10 and a battery 12. Non-volatile memory 14 is associated with the battery management system 10. Sensors 16 are configure to sense battery variables. The sensors 16 may include a temperature sensor, a current sensor, and a voltage sensor.

The invention claimed is:

1. A method for initializing and operating a battery management system of a battery, comprising:
   starting the battery management system;
   reading, during a startup process after the starting of the battery management system, with the battery management system, an old state of charge of the battery from a nonvolatile memory associated with the battery, the nonvolatile memory being operably connected to the battery management system, the old state of charge being a state of charge value that was previously stored in the nonvolatile memory during a previous shutdown process of the battery management system;
   measuring, during the startup process, with a first sensor that is operably connected to the battery management system, a measured open-circuit voltage of the battery;
   determining, during the startup process, with the battery management system, a measured state of charge based on the measured open-circuit voltage;
   determining, during the startup process, with the battery management system, an estimated state of charge of the battery as a function of both the old state of charge of the battery and the measured state of charge;
   performing, during the startup process, with the battery management system, a plausibility check of the estimated state of charge by determining a difference between the measured state of charge and the old state of charge, the plausibility check passing in response to the difference between the measured state of charge and the old state of charge being less than the predetermined threshold value, the plausibility check failing in response to the difference between the measured state of charge and the old state of charge being greater than a predetermined threshold value;
   switching off the battery in response to the plausibility check failing; and
   initializing a state of charge value in the battery management system using the estimated state of charge and operating the battery management system with the initialized state of charge value in response to the plausibility check passing.

2. The method of claim 1, further comprising:
   performing, with the battery management system, a further plausibility check of the measured state of charge, the further plausibility check being performed one of before the battery management system is switched off and before the initialization of the state of charge of the battery system, the further plausibility check comprising:
   comparing the measured state of charge with an integral of a current of the battery.

3. The method of claim 1, the determining of the measured state of charge further comprising:
   determining the measured state of charge as a function of the measured open-circuit voltage and a family of characteristics dependent on at least one of a temperature of the battery and the open-circuit voltage of the battery.

4. The method of claim 1, further comprising:
   measuring, with a second sensor that is operably connected to the battery management system, a current of the battery;
   initializing an open-circuit voltage value in the battery management system using the measured open-circuit voltage; and
   initializing a current value in the battery management system using the measured current.

5. The method of claim 4, further comprising:
   storing, in the nonvolatile memory, at least one of the estimated state of charge, the measured open-circuit voltage, the measured current, a temperature of the battery, and model parameters of a mathematical ageing process of the battery, the storing being performed at least one of before switching off the battery management system and during operation of the battery management system.

6. The method of claim 1, further comprising:
   adapting the estimated state of charge over a plurality of measured value cycles during operation of the battery.

7. The method as claimed in claim 6, the adapting of the estimated state of charge further comprising:
  adapting the estimated state of charge using input variables of an ageing model, the input variables including:
    a measured voltage, a temperature, an integrated charging current and the old state of charge value during a last switching off of the battery, and
    a standstill duration, a measured voltage, a temperature and the measured state of charge when starting the battery management system.

8. The method of claim 1, the determining of the estimated state of charge further comprising:
  determining the estimated state of charge as a weighted average of the old state of charge and the measured state of charge.

9. The method of claim 8, the determining of the estimated state of charge further comprising:
  determining the weighted average with a balanced weighting of the old state of charge and the measured state of charge.

10. The method of claim 8, the determining of the estimated state of charge further comprising:
  determining the weighted average with an unbalanced weighting of the old state of charge and the measured state of charge, the unbalanced weighting being based on a period of time between storage of the old state of charge in the nonvolatile memory and determination of the measured state of charge.

* * * * *